United States Patent
Donohoe et al.

(10) Patent No.: US 6,716,758 B1
(45) Date of Patent: Apr. 6, 2004

(54) ASPECT RATIO CONTROLLED ETCH SELECTIVITY USING TIME MODULATED DC BIAS VOLTAGE

(75) Inventors: Kevin G. Donohoe, Boise, ID (US); Mirzafer Abatchev, Boise, ID (US); Robert Veltrop, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 382 days.

(21) Appl. No.: 09/382,584

(22) Filed: Aug. 25, 1999

(51) Int. Cl.[7] ............................................. H01L 21/302
(52) U.S. Cl. .................... 438/706; 438/714; 118/723
(58) Field of Search ........................ 118/723; 156/345; 438/706, 710, 712, 713, 714, 695, 975

(56) References Cited

U.S. PATENT DOCUMENTS

| | | | |
|---|---|---|---|
| 5,122,225 A | 6/1992 | Douglas | 156/643 |
| 5,468,342 A | * 11/1995 | Nulty et al. | 156/643.1 |
| 5,478,437 A | * 12/1995 | Hashemi et al. | 156/646.1 |
| 5,562,801 A | 10/1996 | Nulty | 156/643.1 |
| 5,683,538 A | 11/1997 | O'Neill et al. | 156/345 |
| 5,770,097 A | 6/1998 | O'Neill et al. | 216/60 |
| 5,783,282 A | * 7/1998 | Leiphart | 428/138 |
| 5,882,488 A | * 3/1999 | Leiphart | 204/192.32 |
| 6,033,481 A | * 3/2000 | Yokogawa et al. | 118/723 |

OTHER PUBLICATIONS

M. F. Doemling, et al., *Photoresist erosion studied in an inductively coupled plasma reactor employing $CHF_3$, J. Vac. Sci. Technol. B* 16(4), Jul./Aug. 1998.

* cited by examiner

*Primary Examiner*—Kin-Chan Chen
(74) *Attorney, Agent, or Firm*—Dickstein Shapiro Morin & Oshinsky LLP

(57) ABSTRACT

A modulated bias power etching method for etching a substrate is disclosed. The method alternatively deposits and etches material from a low aspect area of an integrated circuit device to form a static area while etching material from a high aspect area. The modulation pulse period and repetition rate are adjusted to permit deposition at low aspect ratio and very little or no deposition at high aspect ratio during the deposition cycle and to permit etching of the material deposited on the low aspect ratio area and etching of the material in the high aspect ratio area during the etching cycle.

37 Claims, 7 Drawing Sheets

ASPECT RATIO CONTROLLED ETCH SELECTIVITY USING TIME MODULATED DC BIAS VOLTAGE

FIELD OF THE INVENTION

The present invention relates to the fabrication of integrated circuit devices and, in particular, to a selective plasma etch process using a time modulated DC bias to simultaneously control deposition and etching for different portions and/or aspect ratios of the integrated circuit device.

BACKGROUND OF THE INVENTION

Etch techniques are widely used during the fabrication of semiconductor devices for integrated circuits. Chemical etching in liquid or gaseous form, for example, is used to remove a material not protected by hardened photoresist material. A particularly effective etching technique is plasma etching. Plasma is a collection of electrically charged and neutral particles.

In a plasma, the density of negatively-charged particles (electrons and negative ions) is generally equal to the density of positively-charged particles (positive ions). Plasma generation may be conducted by applying power to electrodes in a chamber of a reactor. In diode or parallel plate reactors, power is applied to one electrode to generate a plasma. In triode reactors, power is typically applied to two of three electrodes to generate a plasma.

In radio frequency (RF) plasma generation, for a diode reactor, a sinusoidal signal is sent to an electrode or a pair of electrodes. Conventionally, a chuck or susceptor is the powered electrode. Examples of parallel plate reactors include the 5000MERIE from Applied Materials, Santa Clara, Calif.

A plasma source material, typically includes one or more gases, such as, for example, argon, silane ($SiH_4$), oxygen, TEOS, diethylsilane, silicon tetrafluoride ($SiF_4$) and fluorocarbon gases, directed to an interelectrode gap between the pair of electrodes. The amplitude of the RF signal must be sufficiently high for a breakdown of plasma source material. In this manner, electrons have sufficient energy to ionize the plasma source material and to replenish the supply of electrons to sustain a plasma. The ionization potential, the minimum energy needed to remove an electron from an atom or molecule, varies with different atoms or molecules.

In a typical triode reactor, three parallel plates or electrodes are used. The middle or intermediate electrode is conventionally located in between a top and bottom electrode, and thus two interelectrode cavities or regions are defined (one between top and middle electrode and one between middle and bottom electrode). The middle electrode typically has holes in it. Conventionally, both the top and bottom electrode are powered via RF sources, and the middle electrode is grounded. Examples of triode reactors are available from Lam Research, Fremont, California, and Tegal Corporation Ltd., San Diego, Calif.

Parallel plate and triode reactors generate capacitively coupled plasmas. These are conventionally "low density" plasmas (ion-electron density of less than or equal to $10^{10}$ ions-electrons per $cm^3$) as compared with high-density plasmas (ion-electron density on the order of about $10^{11}$ to about $10^{13}$ ions-electrons per $cm^3$) which are generated by systems such as, electron cyclotron resonance (ECR), inductively coupled plasma (ICP), microwave and other high frequency source plasmas. For ICP systems, an inductive coil (electrode) is conventionally driven at a high frequency using an RF supply. The inductive coil and RF supply provide a source power, or top power, for plasma generation. In ECR systems, a microwave power source (for example, a magnetron) is used to provide a top power. All of these systems, including ICP and ECR systems, have a separate power supply known as bias power or bottom power, which may be employed for directing and accelerating ions from the plasma to a substrate assembly or other target. In either case, voltage that forms on a susceptor or chuck (also known as the direct current (DC) bias), is affected by the bottom power (RF bias); whereas, current is affected by the top power.

Plasma may also be used to deposit films over a substrate. In a plasma enhanced CVD (PECVD) process, high electron temperatures are employed to increase the density of disassociated species within the plasma. These disassociated species or radicals are available for deposition on a substrate assembly surface. The high-density plasma may be employed to facilitate deposition. A high density plasma is typically defined as having an ion-electron density on the order of $10^{11}$ to $10^{13}$ ions-electrons per $cm^3$. Additionally, in a pulsed-PECVD process a pulsed-plasma is provided by turning the bias power "on" and "off".

As noted, plasma apparatus have been used to either deposit or remove material from an integrated circuit device, for example, a wafer containing many die.

In designing a plasma etching or deposition process, it is desirable to have a large process window with a sensitivity as small as possible, so that large discrepancies in equipment performance can be tolerated. As the film thickness and device dimensions decrease, etch selectivity and uniformity become increasingly significant. Selectivity is the ability to etch one layer faster than another layer under the same etching conditions whereas uniformity refers to the ability of the process to evenly remove the desired layer.

In prior methods, plasma etch/or deposition selectivity has been controlled by various methods, including varying the gas phase chemistry through adjustments in the plasma reactor gases, adjusting the operating pressure, adding diluent gases, or increasing the pumping speed to allow high flow at low pressure operation.

Etch selectivity is of particular interest when, for example, a device requires selective removal of different layers to obtain desired shapes and dimensions in various parts of the same device. Apart from selectivity, etching rates and profiles depend on feature size and pattern density. Problems in achieving microscopic uniformity arise often as most high performance etches are aspect ratio-dependent etches (ARDE). In ARDE etches, the rate of oxide removal is dependent upon the aspect ratio of the opening, which is defined as the ratio of the depth of the opening to the diameter. As such, features with a high aspect ratio etch more slowly than trenches with a small aspect ratio. In other words, the oxide etch rate, in terms of linear depth etched per unit time, is smaller for high aspect ratio openings than for low aspect ratio openings. Thus, the etching rate decreases as the feature dimensions are reduced. Alternatively, the features are etched such that they do not have a uniform cross section along the length of the feature.

Advanced technologies require high etch performance in high aspect ratio features, and demand high etch performance in layers having features at different aspect ratios. Several attempts have been made to overcome the aspect ratio-dependency effects and the above-described difficulties in the etching process. However, the prior methods have small process windows which are difficult and expensive to sustain in manufacturing. Some of the methods also require extensive redesign of the process or devices, and use of unproven and costly equipment. Accordingly, there is a need for an improved etch selectivity, with an improved process window, which has the ability to operate under a wide range of aspect ratios.

SUMMARY OF THE INVENTION

The present invention relates to a method for improving the process window for etch processes, such as for example, a Self-Aligned Contact (SAC) etch using a time modulated DC bias in a plasma etching apparatus. The present invention pulses the bias power to tailor and modulate a deposition vs. removal ratio of similar materials having different aspect ratios to obtain better control over the plasma process and the ability to better etch certain features, such as self-aligned contacts.

Since both etch rate and deposition are dependent upon the aspect ratio of the area in which a material is to be removed or deposited, the present invention exploits the relationship between etch rate/deposition rate and aspect ratio and DC bias. Deposition rates of material are generally lower at higher aspect ratios, and the overall deposition rate increases as the DC bias voltage decreases. Etch rates of materials generally increase as DC bias voltage increases. There is a DC bias voltage ($V_{DC}$) range below which deposition occurs over a wide range of aspect ratios and above which etching occurs under a wide range of aspect ratios. The present invention provides an etching process in which the DC bias voltage is manipulated so that the etch rate can be controlled under etch processes that require both selectivity in a relatively low aspect ratio part of a wafer and the ability to etch higher aspect ratio features into the same feature, or other features, on the same wafer.

The method of the present invention uses a time modulated bias voltage to control the transition from etch to deposition stages for devices with different aspect ratios. For example, a protective layer of material may be deposited on a first position on a semiconductor wafer while a simultaneous etching process takes place at a second position, on the same wafer. Low bias conditions allow the deposition on the first position. High bias conditions further permit the etch front to move towards completion at the second position, without the removal of the features under the protective layer which is deposited at the first position.

The use of time modulated bias power in etching techniques permits features such as SAC to be defined among materials with similar etch properties, such as thermal oxides and BPSG. In addition, time modulated bias voltage may be used in semiconductor integrated circuits using materials with different etch properties, such as silicon nitride and silicon oxide. In such cases, the process window is expected to be greatly improved.

In addition, the ability to tailor the amount of deposit of each aspect ratio in relation to the amount of etch, which is less sensitive to aspect ratio, permits process optimization over a wide range of designs and features. Moreover, the present invention will improve the capability to precisely control etching in applications that use different aspect ratio features and which must stop on thin etch stop layers. Additional advantages of the present invention will be apparent from the detailed description and drawings, which illustrate preferred embodiments of the invention.

BRIEF DESCRIPTION OF THE DRAWINGS

in FIG. 5.

DETAILED DESCRIPTION OF THE PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention. The following detailed description is, therefore, not to be taken in a limiting sense, and the scope of the present invention is defined by the appended claims.

The terms "wafer" or "substrate" used in the following description may include any semiconductor-based structure that has an exposed silicon surface. Wafer and structure must be understood to include silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a wafer or substrate in the following description, previous process steps may have been utilized to form regions or junctions in the base semiconductor or foundation.

The present invention relates to a selective plasma etch process using modulated DC bias to control both the deposition and the etch at different aspect ratios of a semiconductor integrated circuit. The method improves the process window in the fabrication of the IC and operates under a wide range of aspect ratios. As discussed in more detail below, the present invention is an improved etching process using a time modulated bias voltage to control the transition from etch to deposition stages for integrated circuit devices with different aspect ratios.

The aspect ratio is the ratio of the depth to the width of a bottom dimension of an integrated circuit device. As used herein, the term "low aspect ratio" generally refers to aspect ratios of less than or equal to about 2:1 whereas the term "high aspect ratio" as used herein generally refers to aspect ratios of greater than or equal to about 3:1. The present invention may be used to selectively etch integrated circuit devices having aspect ratios of from about 0.5 to about 20.0.

Figure 1:
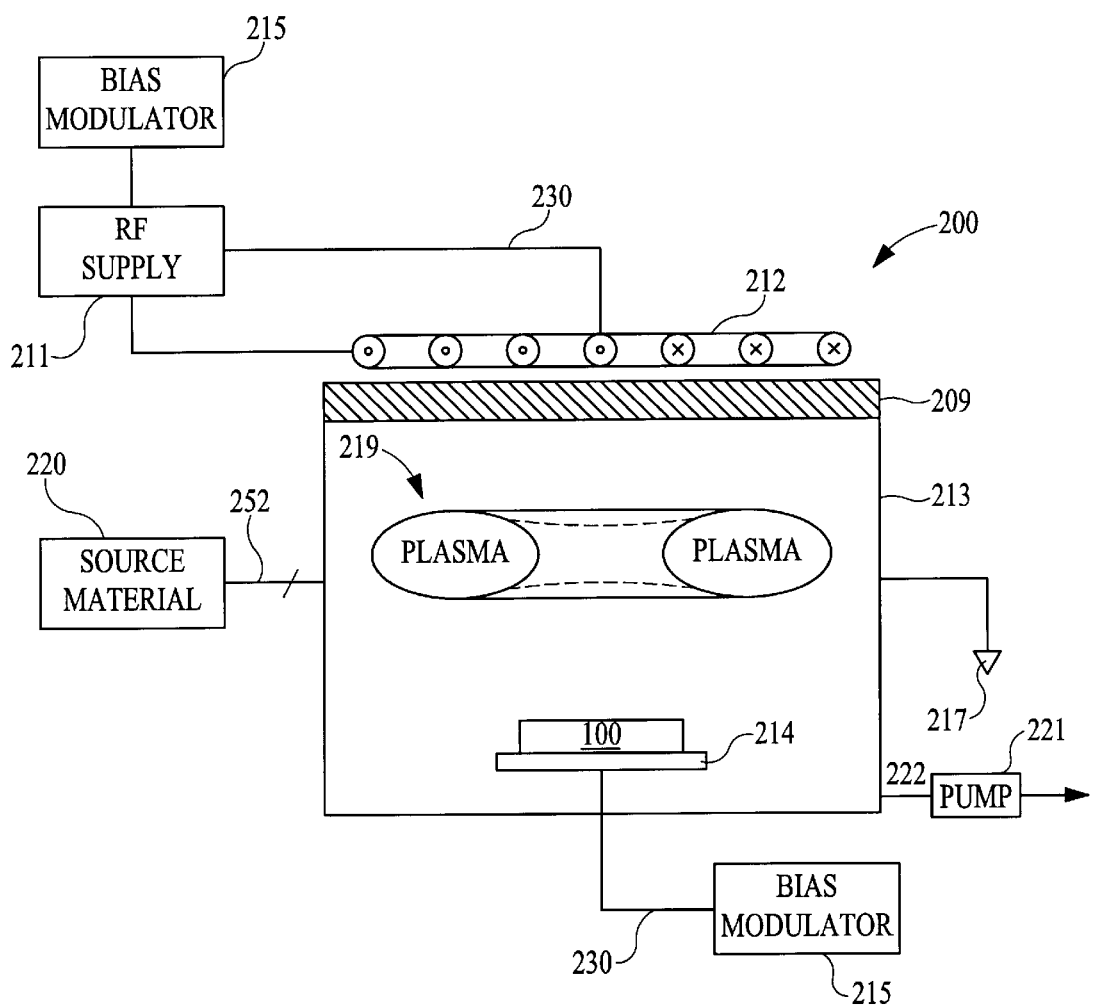
FIG. 1 is an exemplary apparatus according to the present invention.

Referring now to the drawings, where like elements are designated by like reference numerals, a representative substrate etched according to the present invention is illustrated in FIG. 1 which shows a plasma etching/deposition apparatus 200 according to the present invention. Apparatus 200 including a radio frequency ("RF") source power supply 211, a coil 212, a chamber 213 and a dielectric plate 209. The chamber 213 is connected to a ground potential 217. An integrated circuit device 100 is mounted onto electrode 214 which applies a bias voltage or bottom power. The bias voltage is modulated by a bias voltage modulator 215 via electrode 214. Electrode 214 may be an electrostatic-chuck or susceptor for holding the integrated circuit device 100 during the etching process. Modulated-bias plasma 219 is generated in chamber 213 from source material 220. Source material 220 may be provided to chamber 213 via one or more feed tubes 252. The contents of chamber 213 are evacuated by vacuum pump 221 via line 222. The DC bias voltage and/or the source power 211 are modulated by respective bias modulator 215 in a duty cycle of from about 10% to about 90%.

Figure 2:
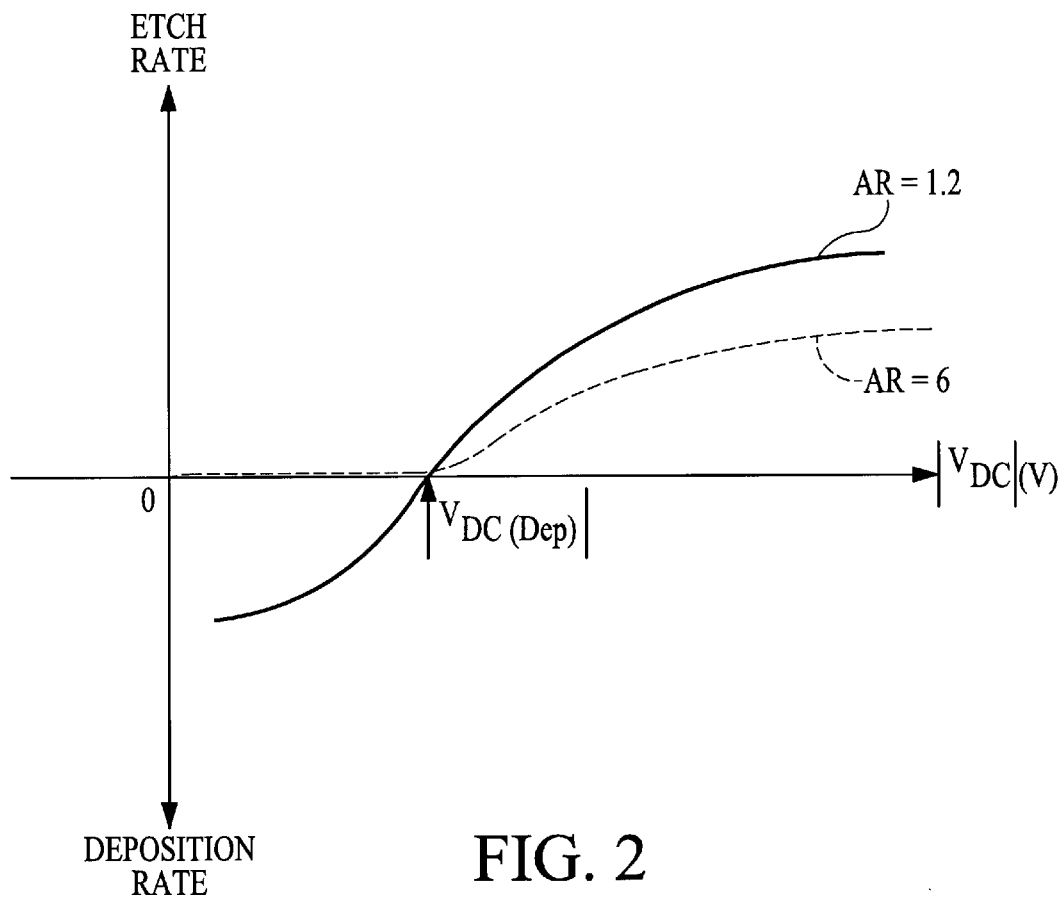
FIG. 2 is a graph showing the variations of the etch and deposition rates as a function of the absolute value of the DC bias voltage for two aspect ratio-dependent etch rates.
Figure 8:
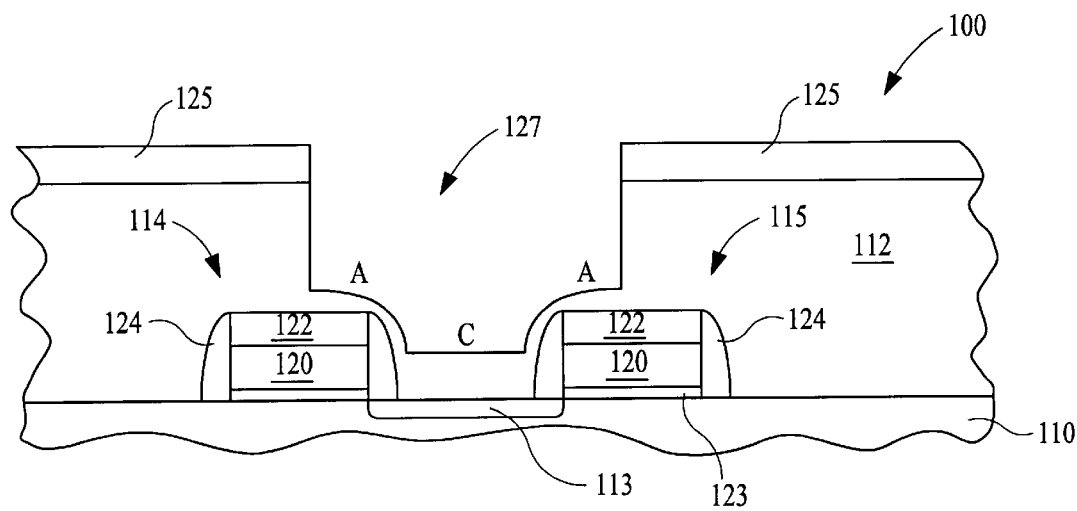
FIG. 8 is a diagrammatic cross-sectional view of a semiconductor wafer according to the present invention at a processing step subsequent to that shown in FIG. 7.
Figure 9:
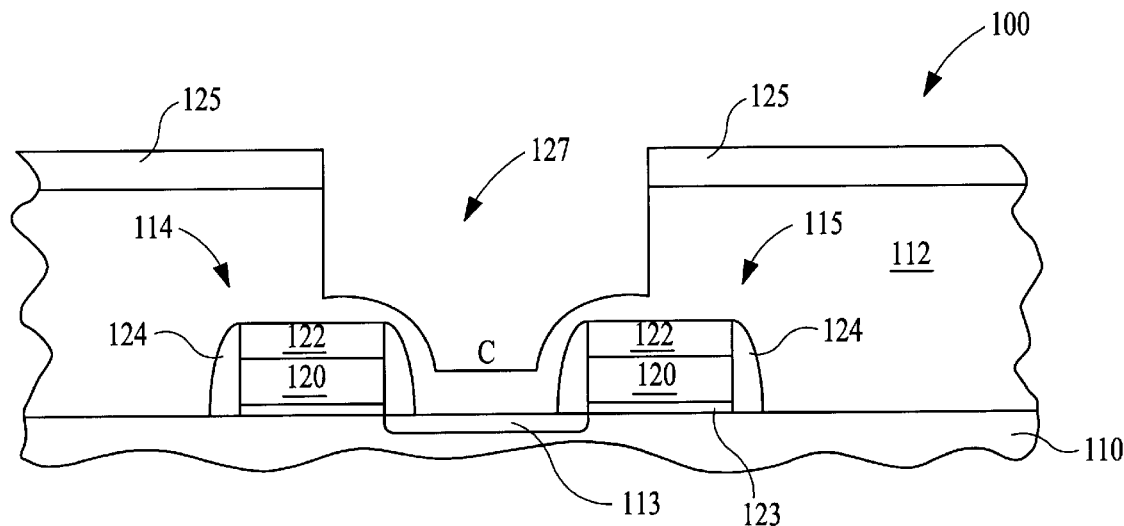
FIG. 9 is a diagrammatic cross-sectional view of a semiconductor wafer according to the present invention at a processing step subsequent to that shown in FIG. 8.
Figure 10:
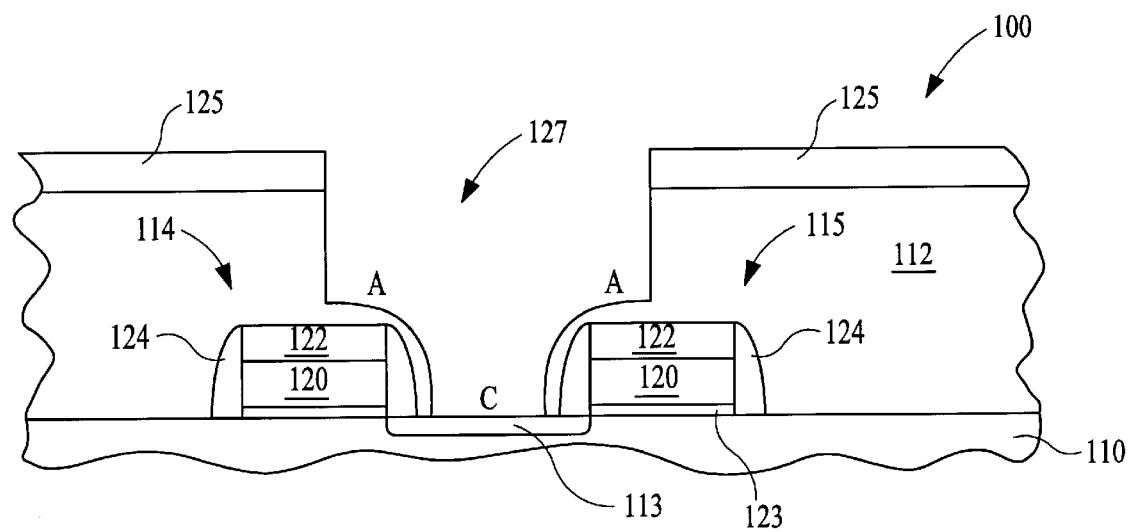
FIG. 10 is a diagrammatic cross-sectional view of a semiconductor wafer according to the present invention at a processing step subsequent to that shown in FIG. 9.

Reference is now made to FIG. 2. The etch rate and deposition rate of a silicon substrate having an aspect ratio of 1.2 and an aspect ratio of 6 were measured when the substrate was contacted with a $CHF_3$ plasma. The device was contacted with the $CHF_3$ plasma for a predetermined time and the etch rate and deposition rate were measured as a function of bias the absolute value of voltage ($V_{DC}$). As can be seen from the figure, when $|V_{DC}|<|V_{DC}(dep)|$ (the voltage at which deposition of a protective layer occurs for any given aspect ratio), deposition of the protective layer occurred for an aspect ratio 1.2 (for example, position A as shown in FIGS. 8–10 below), but not for an aspect ratio of 6.0 (for example, position C as shown in FIGS. 8–10 below). Likewise, when $|V_{DC}|>|V_{DC}(dep)|$, etching occurred for both the 1.2 aspect ratio and the 6.0 aspect ratio. However, as can be seen from FIG. 2, the etch rate for the lower aspect ratio area was greater. Thus, as described below with reference to FIGS. 5–10, when the bias voltage $|V_{DC}|$ is modulated between $|V_{DC}|<|V_{DC}(dep)|$ and $|V_{DC}|>|V_{DC}(dep)|$, etching occurs on the area having a higher aspect ratio since there is essentially no deposition for a bias voltage less than $|V_{DC}(dep)|$ while there is removal of material at a bias voltage greater that $|V_{DC}|$. Likewise, the lower aspect ratio area, i.e. the area over insulating spacers 124 and transistor gate stacks 114, 115 in FIGS. 5–10, is not depleted since there is a deposition of protective material at a bias voltage less than $|V_{DC}(dep)|$ and a removal of material at a bias voltage greater that $|V_{DC}|$. Thus, the bias voltage can be modulated between (i) a voltage $|V_{DC}|$ which is greater than $|V_{DC}(dep)|$ to effectuate etching of the low aspect ratio material and (ii) a voltage $|V_{DC}|$ which is less than $|V_{DC}(dep)|$ to effectuate deposition of a protective material on the low aspect ratio material to assure that the material etched at the low aspect ratio area during a bias voltage greater than $|V_{DC}(dep)|$ is the material that is deposited when the bias voltage is greater than $|V_{DC}(dep)|$. In FIG. 2, the value of $|Vdc|$ is shown to control, or to describe, the conditions that lead to the transition from etching to deposition. Other variables, or combinations of variables, can also affect this transition point and can affect the value of Vdc(dep). For example, one could vary the source and bias powers together and keep Vdc relatively constant while still varying the results of etch or deposition on the substrate. Under some conditions, one might even modulate the gas flowrates. However, the DC Bias is the preferred embodiment because it is easy to vary over a wide range of values, including values much larger than $|Vdc(dep)|$.

Figure 3:
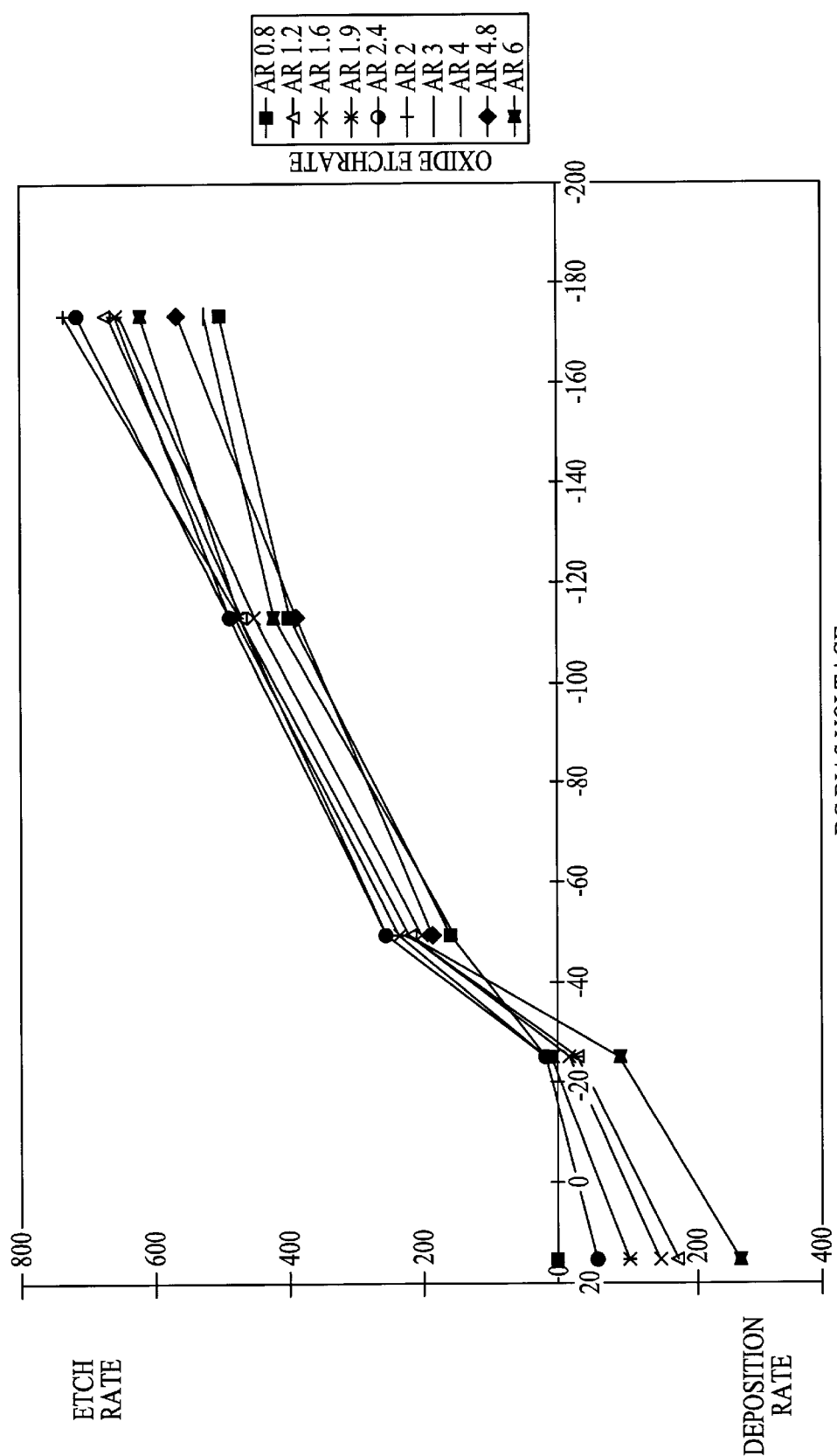
FIG. 3 is a graph showing the variations of the etch and deposition rates as function of the modulated DC bias voltage for ten aspect ratio-dependent etch rates, in accordance with the present invention.

Reference is now made to FIG. 3. In accordance with the present invention, pulsing the $V_{DC}$ will allow continuous etching on point C (high aspect ratio) and deposition on point A (low aspect ratio). The figure shows how the transition from etch to deposition occurs in a $CHF_3$ plasma for integrated circuit devices with 10 different aspect ratios (AR), ranging from 0.8 to 6.0. As the DC bias voltage is decreased from a high magnitude, such as 180 volts in this example, the etch rates decrease accordingly until the transition from etching to depositions occurs. This transition occurs at $V_{DC}(dep)$ and takes place over a narrow range of $|Vdc|$, in our example from about 25 volts. It should be noted that, as with FIG. 2, the aspect ratio 6.0 showed no deposition for voltages below $|Vdc(dep)|$. This interval represents the deposition regime. $|Vdc(dep)|$ represents, therefore, the cutoff DC bias voltage below which deposition occurs over a wide range of aspect ratios, and above which etching occurs under a wide range of aspect ratios.

The FIG. 3 graph demonstrates that a plasma operation that varies from low to high magnitude of $V_{DC}$ can continuously etch at high aspect ratios (as exemplified by position C in FIGS. 8–10 below) and alternatively deposit or etch the deposit at lower aspect ratios (as exemplified by position A in FIGS. 8–10 below). The present invention uses time modulated voltage to deposit a protective layer at position A while maintaining a rather constant etch rate at position C. Thus, the present invention uses low bias time and conditions to deposit the protective layer at position A and not stop the etch at position C. The invention further uses a high bias time and conditions to move the etch front at position C, toward completion.

Figure 4:
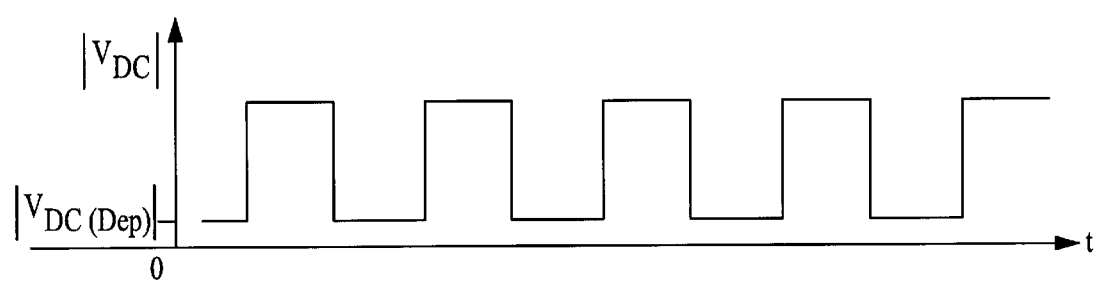
FIG. 4 is an exemplary duty cycle graph according to the present invention.

While it is preferable to modulate the bias voltage to tailor the selective etching, it should be understood that the present invention allows modulation of either the bias power or the source power to generate the desired process result from $V_{DC}$ modulation. As set forth above, the time periods of the pulsing that will work are constrained by relative deposition and etch rates but are based on a duty cycle of from about 10 to about 90%. A representative duty cycle plot according to the present invention is illustrated in FIG. 4. The figure shows a pulse cycle where when bias voltage $|V_{DC}|$ is less than $|V_{DC}(dep)|$, material is etched at a high aspect ratio position (such as position C as shown in FIGS. 8–10 below) and a protective material is deposited at a low aspect ratio position (such as position A as shown in FIGS. 8–10 below). When bias voltage $|V_{DC}|$ is greater than $|V_{DC}(dep)|$, material is etched at both low and high aspect ratio positions.

Figure 5:
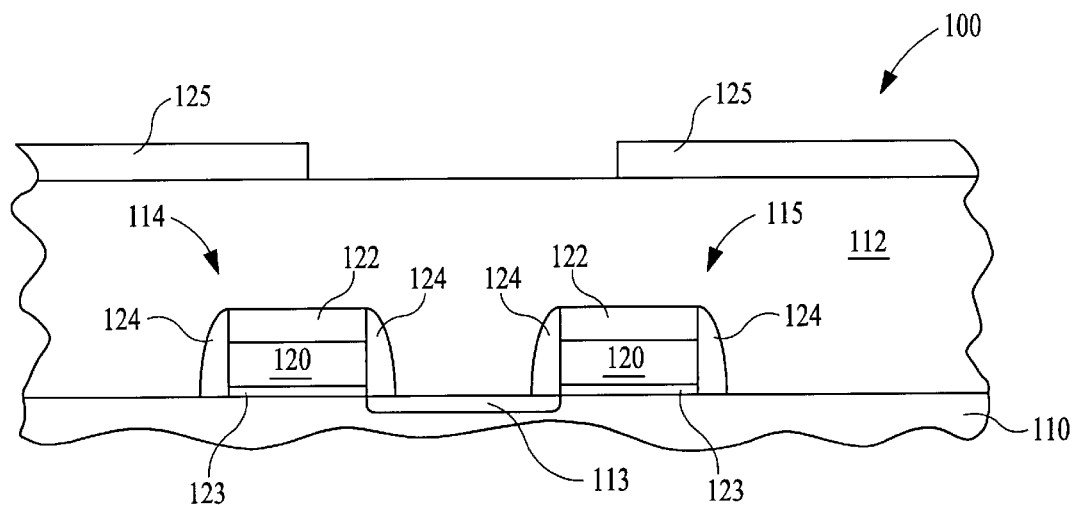
FIG. 5 is a diagrammatic cross-sectional view of a semiconductor wafer according to the present invention at an intermediate stage of processing.

Reference is now made to FIG. 5. The integrated circuit device partially shown in cross section in FIG. 5 is at an intermediate stage of processing. A device 100 includes a substrate 110 having an insulating layer 112 formed thereon. Insulating layer 112 may be a BPSG layer. Substrate 110 may also have transistor gate stacks 114, 115 having an conductive layer 120 (e.g. doped polysilicon), an insulating layer 123, an insulating cap layer 122 and insulating spacers 124 formed around the transistor gate stacks 114, 115. The insulating layer, cap layer and spacers may be formed of, for example, silicon nitride or silicon oxide. The transistor gate stacks 114, 115 formed over the substrate 110 between a doped active area 113. While the present invention is described showing two transistor gate stacks 114, 115 between a single doped active area 113 for the purposes of illustration, it should be understood that the invention is not so limited, but has applicability to more complex integrated circuit structures as well.

Still with reference to FIG. 5, a patterning layer 125, such as a mask, is formed over the insulating layer 112 where the etch is desired. In the FIG. 5 structure, an etch down to active area 113 is desired. Insulating layer 112 is typically formed of an oxide layer such as BPSG or the like. As noted above, insulating spacers 124 and insulating layer 123 are preferably formed of a silicon oxide or silicon nitride. Since both the insulating layer 112 and the insulating spacers 124 are formed of materials that react similarly to a plasma etch, the device 100 can not be selectively etched by conventional methods. The device 100 is thus placed in the plasma etching apparatus having a time modulated DC bias voltage as described above with reference to FIG. 1 and the device 100 is etched according to the present invention by modulating the bias voltage as described with reference to FIGS. 2–4.

The plasma etching gas may be any gaseous material known for etching. Examples of suitable plasma etching gases are those such as fluorocarbon gases and hydrofluorocarbon containing gases, such as, for example, $CF_4$, $C_2F_6$, $C_3F_8$ and $CHF_3$ and the like. According to a preferred embodiment, the plasma etching process uses as process gas including a hydrofluorocarbon, preferably a gas mixture including trifluoromethane ($CHF_3$). It should be understood that the selection of the plasma etching gas will be determined by the substrate to be etched as well as the physical parameters of the etching process such as power, pressure, temperature and the like. The plasma is formed at a high power, such as, for example, from about 400 to about 1500 watts (RF) at a pressure of from about 2 to about 40 mTorr. The bias power may be adjusted from about 0 to about 1000 watts depending upon the physical parameters of the substrate and the layers to be etched. The DC bias voltage may be modulated from between about 0V and about 300V. The device may be etched for a time period of from about 1 to about 100 seconds depending upon the physical parameters of the substrate and the layers to be etched. Additionally, the duty cycle of the time modulated DC bias may be from about 10 to about 90%, preferably from about 25 to about 75%.

Figure 6:
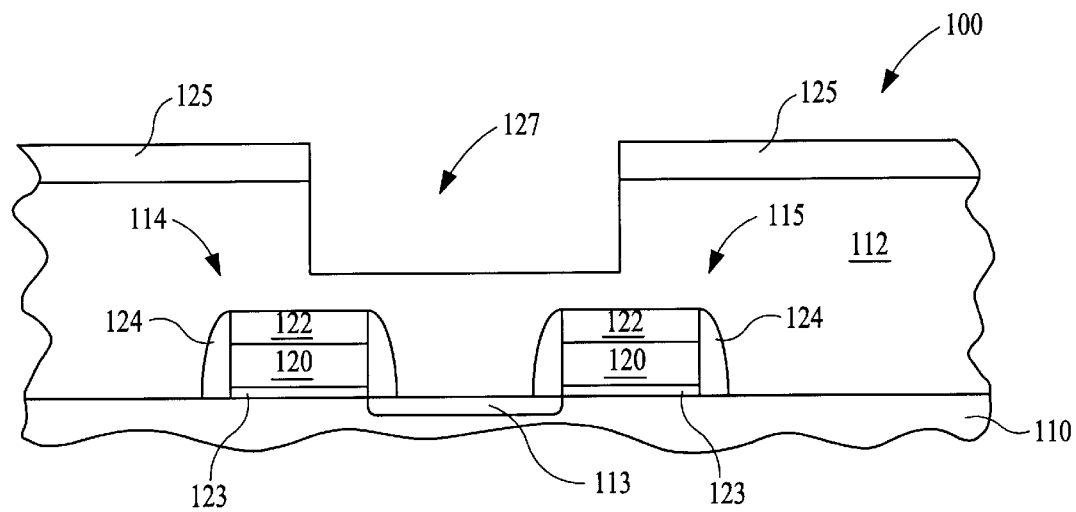
FIG. 6 is a diagrammatic cross-sectional view of a semiconductor wafer according to the present invention at a processing step subsequent to that shown.
Figure 7:
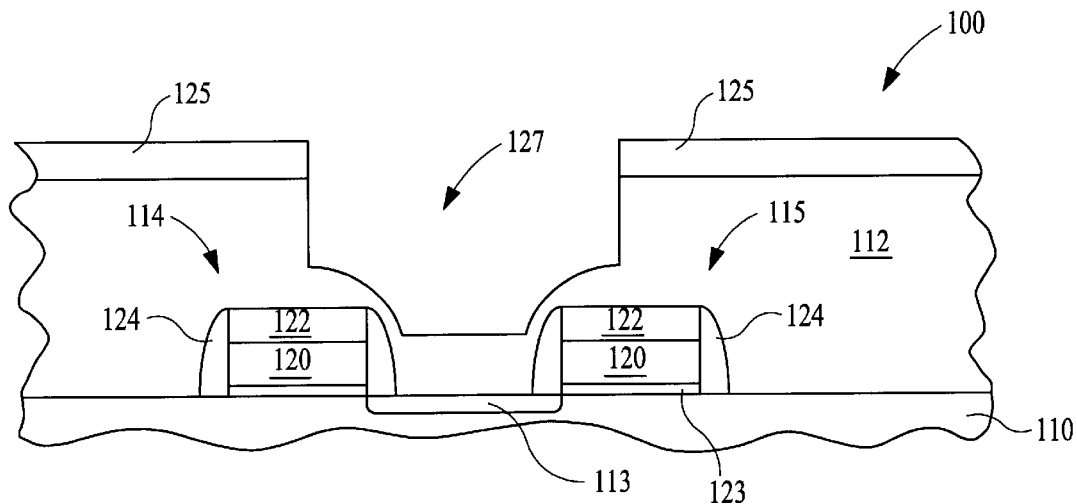
FIG. 7 is a diagrammatic cross-sectional view of a semiconductor wafer according to the present invention at a processing step subsequent to that shown in FIG. 6.

Reference is made to FIG. 6. The device is etched in the plasma etching apparatus to form hole 127 in the area not covered by mask 125. As can be seen from FIG. 6, the hole 127 is etched in device 100 for a predetermined period of time to etch to just above transistor gate stacks 114, 115 and the DC bias voltage is modulated between (i) a voltage above $|V_{DC}(dep)|$, the point at which there is no etching and no deposition, to effectively etch the hole 127 and (ii) a voltage below $|V_{DC}(dep)|$ to deposit protective material on the edges of the hole 127 having a low aspect ratio. The device is processed as shown in FIGS. 7–10. The DC bias power is modulated such that material is etched from the higher aspect ratio area C of hole 127 at a greater rate than lower aspect ratio area A when $|V_{DC}|$ is greater than $|V_{DC}(dep)|$. $|V_{DC}|$ is then modulated to a voltage below $|V_{DC}(dep)|$ where protective material is deposited on the area A of hole 127 at a greater rate than is deposited at the higher aspect ratio area C of hole 127. The protective material deposited on the area A is subsequently etched away and redeposited by the DC bias modulation, thus allowing the hole 127 above transistor gate stacks 114, 115 to remain static. By modulating the DC bias voltage, the present invention allows the build up and removal of material at the low aspect ratio area A of contact hole 127 which lies over transistor gate stacks 114, 115 while removing at a greater rate the BPSG material that overlies active area 113. Thus, the method according to the present invention allows the etching of a self-aligned contact without removal of the insulating spacers of the transistor gate stacks 114, 115. Additionally, the present invention allows the targeted etching to active area 113 without significantly etching away portions of the active area through the methodical modulated DC bias etching.

The above description illustrates preferred embodiments which achieve the objects, features and advantages of the present invention. It is not intended that the present invention be limited to the illustrated embodiments. For example, while the present invention has been described with reference to a self-aligned contact, it should be understood that the present invention may be used to fabricate any necessary features in a semiconductor substrate, such as, for example, a trench or a pillar. Additionally, it should be understood that the method and apparatus described are but one example of methods and apparatus that may be used in accordance with the present invention. Any modification of the present invention that comes within the spirit and scope of the following claims should be considered part of the present invention.

What is claimed as new and desired to be protected by Letters Patent of the United States is:

1. A method for selectively etching an opening in a layer of material over a substrate, said method comprising:
    defining an etching pattern on said layer of material;
    placing said substrate containing said layer of material with said defined etching pattern into a reactive chamber;
    introducing an etching gas into said chamber;
    providing a power to said substrate to induce an etching plasma in said gas which etches said opening in said layer of material; and
    changing the operating parameters of said reactive chamber during etching of the opening in said layer of material, such that material is deposited at a first position of said opening which has a first aspect ratio while a second position of said opening having a second aspect ratio is continuously etched, wherein said first aspect ratio is different from said second aspect ratio.

2. The method according to claim 1 wherein said first aspect ratio is less than said second aspect ratio.

3. The method according to claim 2, wherein said first aspect ratio is less than or equal to 5.

4. The method according to claim 3, wherein said first aspect ratio is from about 0.5 to about 5.0.

5. The method according to claim 2, wherein said second aspect ratio is greater than or equal to 3.

6. The method according to claim 5, wherein said second aspect ratio is from about 3.0 to about 20.0.

7. The method according to claim 2, wherein changing the operating parameters of said reactive chamber during the etching includes changing a DC bias voltage from a first voltage to a second voltage during a time period while etching said material layer.

8. The method according to claim 7, wherein said DC bias voltage is pulsed on a duty cycle of from about 10% to about 90%.

9. The method according to claim 8, wherein said pulsed DC bias voltage is obtained by modulating a source power.

10. The method according to claim 8, wherein said pulsed DC bias voltage is obtained by modulating a source power, a bias power voltage or a combination thereof.

11. The method according to claim 7, wherein said time period is calculated according to a first relative deposition rate and a first relative etch rate on said first position, and to a second relative deposition rate and a second relative etch rate on said second position.

12. The method according to claim 7, wherein said DC bias voltage is changed between about 0 volts and about 300 volts.

13. The method according to claim 12, wherein said DC bias voltage is changed between about 10 volts and about 80 volts.

14. The method according to claim 7, wherein said first voltage etches material on said first position and said second position of said opening and said second voltage deposits material on said first position while continuously etching said second position.

15. The method according to claim 1, wherein said etching gas includes a fluorocarbon gas.

16. The method according to claim 1, wherein said etching gas includes a hydrofluorocarbon gas.

17. The method according to claim 16, wherein said etching gas includes $CHF_3$.

18. The method according to claim 1, wherein said etching gas includes a gas selected from the group consisting of $CF_4$, $C_2F_6$, $C_4F_8$, $C_3F_8$ and $CHF_3$.

19. The method according to claim 1, wherein said method includes etching a self-aligned contact.

20. A method for etching a self-aligned contact opening, comprising:

creating a patterned photoresist over a dielectric layer on a substrate, said substrate having spaced structures thereon, said patterned photoresist having an opening in alignment with the space between said spaced structures;

placing said substrate into a reactive chamber;

introducing an etching gas into said chamber;

providing a DC bias voltage to said substrate; and changing said DC bias voltage from a first voltage to a second voltage while etching a self-aligned contact opening between said spaced structures to selectively control deposition of material at a first position of said opening which has a first aspect ratio while continuously etching a second position of said opening which has a second aspect ratio, different from said first aspect ratio.

21. The method according to claim 20 wherein said first aspect ratio is less than said second aspect ratio.

22. The method according to claim 21, wherein said first aspect ratio is less than or equal to 5.

23. The method according to claim 21, wherein said second aspect ratio is greater than or equal to 3.

24. The method according to claim 22, wherein said first aspect ratio is from about 0.5 to about 5.0.

25. The method according to claim 23, wherein said second aspect ratio is from about 3.0 to about 20.0.

26. The method according to claim 20, wherein said etching gas includes a gas selected from the group consisting of a fluorocarbon gas and a hydrofluorocarbon gas.

27. The method according to claim 26, wherein said etching gas includes $CHF_3$.

28. The method according to claim 20, wherein said etching gas includes a gas selected from the group consisting of $CF_4$, $C_2F_6$, $C_3F_8$, $C_4F_8$ and $CHF_3$.

29. The method according to claim 20, wherein said DC bias voltage is modulated on a duty cycle of from about 10% to about 90%.

30. The method according to claim 29, wherein said DC bias voltage is obtained by modulating a source power.

31. The method according to claim 29, wherein said DC bias voltage is obtained by modulating a source power, a bias power or combinations thereof.

32. The method according to claim 20, wherein said changing of said DC bias voltage occurs during a time period calculated according to a first relative deposition rate and a first relative etch rate at said first position, and to a second relative deposition rate and a second relative etch rate at said second position.

33. The method according to claim 20, wherein said DC bias voltage is modulated between about 0 volts and about 300 volts.

34. The method according to claim 33, wherein said DC bias voltage is modulated between about 10 volts and about 80 volts.

35. The method according to claim 20, wherein said first voltage etches material on a first position having a first aspect ratio and a second position having a second aspect ratio, wherein said first aspect ratio is less than said second aspect ratio, and said second voltage deposits material on said first position while continuously etching said second position.

36. A method of etching an opening in a material over a substrate comprising:

applying a time-modulated plasma-inducing voltage to an area of said substrate having a first portion and a second portion; and alternating said voltage between at least a first voltage value and a second voltage value, wherein at said first voltage value material is deposited onto said first portion while said second portion is etched, and at said second voltage value both first and second portions are etched.

37. The method according to claim 36 wherein said voltage is alternated between 0 Volts and 300 Volts.

* * * * *